(12) United States Patent
Iwata et al.

(10) Patent No.: US 6,577,852 B1
(45) Date of Patent: Jun. 10, 2003

(54) AUTOMATIC GAIN CONTROL DEVICE AND METHOD, AND RADIO COMMUNICATION APPARATUS HAVING THE AUTOMATIC GAIN CONTROL FUNCTION

(75) Inventors: Yasushi Iwata, Shizuoka (JP); Yasufumi Ichikawa, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 418 days.

(21) Appl. No.: 09/610,255

(22) Filed: Jul. 5, 2000

(30) Foreign Application Priority Data

Jul. 7, 1999 (JP) .............................. 11-193473

(51) Int. Cl.⁷ .............................. H04B 1/06; H03G 3/10
(52) U.S. Cl. .................. 455/240.1; 455/232.1; 330/279; 375/345
(58) Field of Search .................. 455/232.1, 233.1, 455/234.2, 234.1, 245.1, 251.1, 249.1, 194.2, 126, 127, 247.1, 240.1, 343, 574; 330/129, 124 R, 278, 279, 289; 375/345; 370/314, 317, 311

(56) References Cited

U.S. PATENT DOCUMENTS

| 4,292,598 A | * | 9/1981 | Yasumura | 330/281 |
| 5,050,192 A | * | 9/1991 | Nawata | 375/345 |
| 5,168,505 A | * | 12/1992 | Akazawa et al. | 375/130 |
| 5,347,534 A | * | 9/1994 | Akazawa et al. | 375/150 |
| 5,361,395 A | | 11/1994 | Yamamoto | |
| 5,737,697 A | * | 4/1998 | Yamada | 455/126 |
| 5,752,171 A | * | 5/1998 | Akiya | 455/126 |

FOREIGN PATENT DOCUMENTS

| JP | 11-163782 | 6/1999 |
| WO | 99/30415 | 6/1999 |

OTHER PUBLICATIONS

JP 11-163782 A, Patent Abstracts of Japan, vol. 1999, No. 11, Sep. 30, 1999.
JP 10-134134 A, Patent Abstracts of Japan, vol. 1998, No. 10, Aug. 31, 1998.

* cited by examiner

Primary Examiner—Charles N. Appiah
(74) Attorney, Agent, or Firm—Pearne & Gordon LLP

(57) ABSTRACT

When an input signal S11 is variable-gain-amplified by a variable gain amplifier 1 to obtain a predetermined output signal S12, a variable gain control signal S15 is generated by a detecting circuit 2, an A/D converter 3, an adder 4, and a converting unit 5. Both a latch circuit 6 and an adder 7 calculate a difference between a variable gain control signal generated during a preceding control operation and a present variable gain control signal. When the difference result is equal to "0", a counter 8 counts predetermined stable condition continued time, and thereafter outputs a non-operation setting signal S16. Also, the counter 8 sends out the variable gain control signal generated during the preceding control operation to the variable gain amplifier 1 so as to set the detecting circuit 2, the A/D converter 3, the adder 4, and the converting unit 5 into non-operation conditions thereof.

15 Claims, 6 Drawing Sheets

AUTOMATIC GAIN CONTROL DEVICE AND METHOD, AND RADIO COMMUNICATION APPARATUS HAVING THE AUTOMATIC GAIN CONTROL FUNCTION

BACKGROUND OF THE INVENTION

The present invention generally relates to an automatic gain control (will also be referred to as an "AGC" hereinafter) for gain controlling an input signal whose signal level is varied in a signal reception system of a mobile communication apparatus in such a manner that the level of the input signal is made constant by a feedback loop. More specifically, the present invention is directed to an automatic gain control device and an automatic gain control method, capable of switching an operation of a circuit employed in a control system in response to a condition of an automatic gain control operation, and also is directed to a radio communication apparatus having such an automatic gain control operation.

Conventionally, in various sorts of signal processing apparatuses, for example, radio communication apparatus, strengths of electromagnetic wave reception electric fields are varied by wave attenuate ions in electromagnetic wave propagation paths, so that signal levels of reception signals to be processed are varied. As a result, automatic gain control (AGC) operations are carried out in order to reduce demodulation errors, while making the variation of this reception signal constant. For instance, in portable telephones operated in the CDMA system, PDCs (personal digital cellular) of the TDMA system, and PHSs (personal handy-phone system) in the TDMA/TDD system, a strength of a signal reception electric field is detected from a reception signal, a gain of a variable gain amplifier is automatically controlled in response to this detection signal so as to make a constant level of an output signal. As such an automatic gain control manner, an open-loop control system and a closed-loop control system are known in this field. In the open-loop control system, a gain of a variable amplifier provided at a post stage is controlled in response to a control signal. This control signal is generated by detecting a level variation of an input signal. In the closed-loop control system, a gain of a variable gain amplifier provided at a prestage is controlled in response to this control signal.

In radio communication apparatus for executing such an automatic gain control, reductions of power consumption are required. More specifically, in the case of portable telephones, since rechargeable batteries are employed as power sources thereof, reductions of power consumed in these portable telephones are strongly required in order to prolong, or extend operable time of these portable telephones. Japanese Patent Application No. Hei-9-324111 filed by the Applicant in 1997 describes the radio base station apparatus capable of achieving the low power consumption in the system requiring the AGC circuit.

In the conventional signal processing apparatuses, even under such a condition that an automatic gain control becomes stable, for instance, even under such a stable reception condition that a strength of a reception electric field becomes constant (namely, non-move state in the case of portable telephone), this automatic gain control operation is continuously carried out. This execution may constitute one of factors as to why power consumption is increased. As a result, there is a problem that the power consumption cannot be reduced in the apparatus which requires the automatic gain control operation, and thus, the requirement for the long time operation of this signal processing apparatus can be hardly satisfied.

SUMMARY OF THE INVENTION

The present invention has been made to solve the above-explained problem, and therefore, has an object to provide an automatic gain control device, an automatic gain control method, and a radio communication apparatus having the automatic gain control function, capable of reducing power consumption while executing an automatic gain control operation, and capable of being driven for a long time period.

An automatic gain control device according to first aspect of the present invention, is an automatic gain control device in which an input signal is variable-amplified by variable gain amplifying means to obtain a predetermined output signal, the automatic gain control device comprises: control signal generating means for generating a variable gain control signal in response to an output signal level of the variable gain amplifying means; control signal holding means for holding the variable gain control signal; and operation control means for bringing at least a portion of circuits of the relevant automatic gain control system into a non-operative condition in such a case that a condition detecting level based upon the input signal is not changed for a predetermined time period, and for sending out the variable gain control signal held by the control signal holding means to the variable gain amplifying means under the non-operative condition.

An automatic gain control device, according to second aspect of the present invention, is an automatic gain control device in which an input signal is variable-amplified by variable gain amplifying means to obtain a predetermined output signal, the automatic gain control device comprises: control signal generating means for generating a variable gain control signal in response to an output signal level of the variable gain amplifying means; control signal holding means for holding the variable gain control signal; condition detecting level holding means for holding a condition detecting level in response to the input signal; condition detecting level difference calculating means for calculating a difference between a preceding condition detecting level and a present condition detecting level, which are held by the condition detecting level holding means; and operation control means for bringing at least a portion of circuits of the relevant automatic gain control system into a non-operative condition in the case that the difference of the condition detecting level is equal to zero, and for sending out the variable gain control signal held by said control signal holding means to the variable gain amplifying means under the non-operative condition; and also for releasing the non-operative condition of the circuit of the automatic gain control system when the difference of the condition detecting level is not equal to zero.

Also, according to third aspect of the invention, the operation control means uses the level of the variable gain control signal as the condition detecting level based upon the input signal; and when the level of the variable gain control signal is not changed for a predetermined time period, the operation control means brings at least a portion of the circuits of the relevant automatic gain control system to the non-operation condition.

Alternatively, according to fourth aspect, the automatic gain control device is further comprised of detecting means for detecting the output signal to obtain a detection-signal; and the operation control means uses the level of the detection signal as the condition detecting level based upon the input signal; and when the level of the detection signal is not changed for a predetermined time period, the operation control means brings at least a portion of the circuits of the relevant automatic gain control system to the non-operation condition.

Alternatively, according to fifth aspect, the automatic gain control device is further comprised of reception electric field strength detecting means for detecting a reception electric field strength of an input signal based upon the out signal; and the operation control means uses the reception electric field strength as the condition detecting level based upon the input signal; and when the reception electric field strength is not changed for a predetermined time period, the operation control means brings at least a portion of the circuits of the relevant automatic gain control system to the non-operation condition.

Alternatively, according to sixth aspect, the automatic gain control device is further comprised of fading pitch detecting means for detecting a fading pitch of an input signal based upon the output signal; and the operation control means uses the fading pitch as the condition detecting level based upon the input signal; and when the fading pitch is not changed for a predetermined time period, the operation control means brings at least a portion of the circuits of the relevant automatic gain control system to the non-operation condition.

A radio communication apparatus having an automatic gain control function, according to seventh aspect of the present invention, includes the structure of the automatic gain control device according to any one of first to sixth aspect of the invention is provided with a reception system of the radio communication apparatus; and the automatic gain control device executes an automatic gain control in such a manner that an output signal related to a reception signal received in the reception system is made constant.

An automatic gain control method, according to eighth aspect of the present invention, is an automatic gain control method in which an input signal is variable-amplified by variable gain amplifying means to obtain a predetermined output signal, the automatic gain control method comprises steps of: generating a variable gain control signal in response to an output signal level of the variable gain amplifying means; detecting a change in a condition detecting level based upon the input signal; and bringing at least a portion of circuits of the relevant automatic gain control system into a nonoperative condition in such a case that the condition detecting level is not changed for a predetermined time period, and for sending out the held variable gain control signal to the variable gain amplifying means under the non-operative condition.

An automatic gain control method, according to ninth aspect of the present invention, is an automatic gain control method in which an input signal is variable-amplified by variable gain amplifying means to obtain a predetermined output signal, the automatic gain control method comprises steps of: generating a variable gain control signal in response to an output signal level of the variable gain amplifying means; holding the variable gain control signal; holding a condition detecting level based upon the input signal, and calculating a difference between a preceding condition detecting level and a present condition detecting level; and bringing at least a portion of circuits of the relevant automatic gain control system into a non-operative condition in the case that the difference of the condition detecting level is equal to zero, and for sending out said held variable gain control signal to said variable gain amplifying means under the non-operative condition; and also for releasing the non-operative condition of the circuit of the automatic gain control system when the difference of the condition detecting level is not equal to zero.

Also, according to tenth aspect, as the condition detection level detected based upon the input signal, any one of the following level is employed, i.e., the level of the variable gain control signal; a level of a detection signal generated by detecting the output signal; a reception electric field strength of an input signal detected based upon the output signal; and a fading pitch of an input signal detected based on the output signal.

In the above-described automatic gain control device and method according to the present invention, while the input signal is variable-amplified by the variable gain amplifying means to obtain a predetermined output signal, the variable gain control signal is generated in response to the output signal level of the variable gain amplifying means, and this variable gain control signal is held, and then, the variable gain control signal is sent out to the variable gain amplifying means so as to perform the automatic gain control operation. Then, as the condition detection level detected based upon the input signal, while any one of the following levels is employed, i.e., the level of the variable gain control signal; a level of a detection signal generated by detecting the output signal; a reception electric field strength of an input signal detected based upon the output signal; and a fading pitch of an input signal detected based on the output signal, a change in this condition detecting level is detected. At is time, for example, while the condition detection level is held by the condition detection level holding means, the condition detection difference calculating means calculates a difference between the preceding condition detection level and the present condition detection level.

Furthermore, at least a portion of the circuits of the relevant automatic gain control system is brought into a non-operative condition in such a case that the condition detecting level based upon the input signal is not changed for a predetermined time period, and the held variable gain control signal is sent out to the variable gain amplifying means under this non-operation condition. Both a preselected time period (namely, stable condition continued time) during which the condition detecting level is not changed, and also a predetermined time (namely, operation stop continued time) during which the operation of the circuit of the automatic gain control system is stopped are measured by counting means such as a counter.

Alternatively, in the automatic gain control device, at least a portion of the circuits of the relevant automatic gain control system is brought into the non-operative condition in the case that the difference of the condition detecting level is equal to zero, and the held variable gain control signal to the variable gain amplifying means under the non-operative condition, and also the non-operative condition of the circuit of the automatic gain control system is released when the difference of the condition detecting level is not equal to zero.

Since such an operation control is carried out, the operation of the circuit provided in the automatic gain control system is stopped when the condition of the input signal becomes stable and the automatic gain control condition becomes stable. For example, in the case that the reception signal is handled as the input signal, both the reception electric field strength and the fading pitch is constant, and thus, the reception condition becomes stable, the circuit operation of the automatic gain control system is stopped. As a result, while the automatic gain control operation is carried out in high precision, the consumed power in the automatic gain control device can be reduced. Also, since this automatic gain control device and control method are applied to the radio communication apparatus, the power consumption of this radio communication apparatus may be reduced and also, this radio communication apparatus may be furthermore operated for a long time period. For instance, this automatic gain control function is especially effective as a power saving measure used in a portable telephone in which a rechargeable battery is employed as a power supply.

DETAILED DESCRIPTION OF THE PREFERRED EMBODIMENTS

Referring now to drawings, embodiments of the present invention will be described in detail.

First Embodiment

Figure 1:
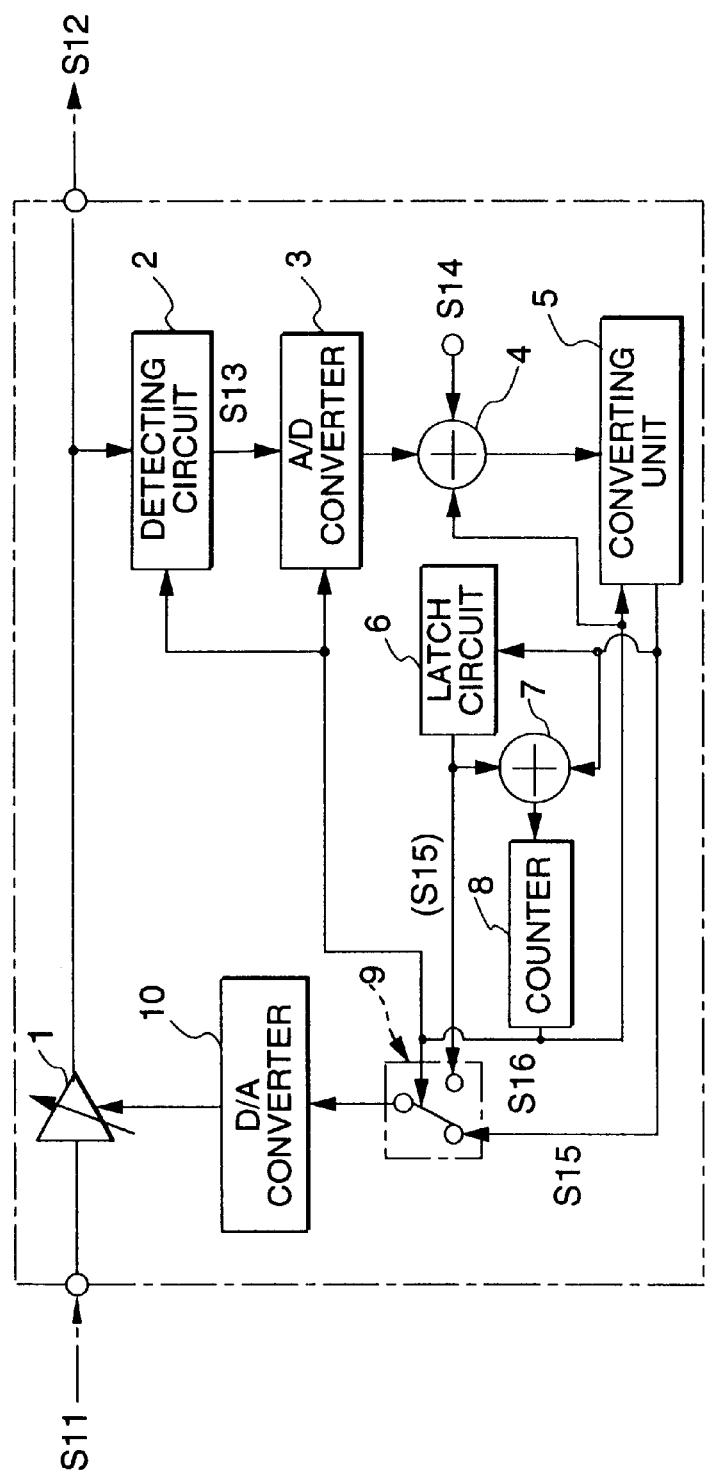
FIG. 1 is a block diagram for showing an arrangement of automatic gain control device/method according to a first embodiment of the present invention.

FIG. 1 is a block diagram for indicating an arrangement of an automatic gain control device, and an arrangement to execute an automatic gain control method, according to a first embodiment of the present invention. In this case, this drawing shows a structural example of an automatic gain control (AGC) circuit provided in a reception system of a radio communication apparatus which is typically known as a portable telephone operated by the CDMA system, the TDMA system, and the TDMA/TDD system.

The automatic gain control device is arranged by employing a variable gain amplifier 1 and an AGC closed-loop control system. This variable gain amplifier 1 is used as a variable gain amplifying means for supplying an output signal S12 to a circuit (not shown) provided at a post stage. The output signal S12 is obtained by variable-gain-amplifying an input signal S11. This AGC closed-loop control system executes an automatic gain control operation for this variable gain amplifier 1.

The AGC closed-loop control system is provided with a detecting circuit 2, an A/D converter 3, and an adder 4. The detecting circuit 2 is employed as a detecting means for outputting a detection voltage S13 which is obtained by detecting the output signal S12 derived from the variable gain amplifier 1. The A/D converter 3 A/D-converts the detection voltage S13 supplied from the detecting circuit 2 into a digital detection voltage S13. The adder 4 outputs a difference result signal between the detection voltage S13 digitally converted from the A/D converter 3 and a preselected convergence value S14. Also, this AGC closed-loop control system is equipped with a converting unit 5, a latch circuit 6, and another adder 7. This converting unit 5 functions as a control signal generating means for converting the difference result signal obtained from the adder 4 into a variable gain control signal S15 to output this variable gain control signal S15. The latch circuit 6 is used as a control signal holding means for holding the variable gain control signal S15 supplied from this converting unit 5 to output this variable gain control signal S15. The adder 7 outputs such a difference result signal between the variable gain control signal S15 which is latched by the latch circuit 6 during the preceding control operation, and the present variable gain control signal S15.

This AGC closed-loop control system is further comprised of a counter 8, a selecting switch 9, and a D/A converter 10. This counter 8 starts its counting operation when the difference result signal derived from the adder 7 is equal to "0", outputs a non-operation setting signal S16 after a preset constant time period has passed, and further, stops outputting of the non-operation setting signal S16 when the counting operation is accomplished after the counting operation has been continued for a preselected time period. The selecting switch 9 selects the variable gain control signal S15 during the preceding control operation, or the variable gain control signal S15 during the present control operation from either the latch circuit 6 or the converting unit 5 in response to the non-operation setting signal S16. The D/A converter 10 converts the variable gain control signal S15 outputted from this selecting switch 9 into an analog variable gain control signal, and then outputs this analog variable gain control signal to a gain control input terminal of the variable gain amplifier 1.

It should be noted that both the counter 8 and the selecting switch 9 function as operation control means, and also, as will be explained later, these operations of the detecting circuit 2, the A/D converter 3, the adder 4, the converting unit 5, the latch circuit 6, and the adder 7 are stopped in such a time period during which the non-operation setting signal S16 is inputted.

Next, a description will now be made of operations of the automatic gain control device/method according to this first embodiment.

In FIG. 1, the input signal S11 is variable-gain-controlled by the variable gain amplifier 1, for example, such a reception signal which is primary-demodulated after the correlation has been detected in the CDMA system is variable-gain-controlled by the variable gain amplifier 1, and then, the output signal S12 derived from the variable gain amplifier 1 is outputted to a circuit (not shown) provided at a post stage.

Also, as the operation of the AGC closed-loop control system, the detection voltage S13 is outputted, and this detection voltage S13 is generated by detecting the output signal S12 by the detecting circuit 2. This detection voltage S13 indicates such a signal level corresponding to an envelope of the output signal S12. This detection voltage S13 is sampled/quantized by the A/D converter 3 so as to be converted into a digital detection signal, and then this digital detection signal is entered into the adder 4. In this adder 4, a difference between the detection voltage S13 and the convergence value S14 is calculated to obtain a difference result signal, and then, this difference result signal is outputted to the converting unit 5. As this convergence value S14, for example, such a convergence range setting value is employed which is obtained by the margin corresponding to a level variation of an input signal caused by a fading phenomenon from a dynamic range (saturation level) of the A/D converter 3. The converting unit 5 converts the difference result signal into a preselected voltage value corresponding thereto, for example, and generates a variable gain control signal S15 used to variably control the gain of the variable gain amplifier 1.

The variable gain control signal S15 derived from the converting unit 5 is entered into one fixed contact of the selecting switch 9, the input of the latch circuit 6, and also the input of the adder 7. Also, the variable gain control signal S15 during the preceding control operation, which is latched by the latch circuit 6, is entered to both the other fixed contact of the selecting switch 9 and the other input of the adder 7. During the normal operation, the present variable gain control signal S15 outputted from the converting unit 5 is selected by the selecting switch 9, and then is entered into the D/A converter 10. Then, the selected variable gain control signal S15 is converted into an analog variable gain control signal by the D/A converter 10, and then, this analog variable gain control signal is entered into the gain control input terminal of the variable gain amplifier 1.

Also, in the adder 7, a calculation is made of a difference between the variable gain control signal S15 during the preceding control operation, which is latched by the latch circuit 6, and the present variable gain control signal S15 derived from the converting unit 5. The resulting difference signal entered into the counter 8 becomes "0", and continues the counting operation only when this difference result signal is equal to "0" This difference result signal become "0" in such a case that the variable gain control signal S15 is not changed, but becomes constant, in other word, when the strength of the reception electric field becomes constant, namely under stable condition (for example, non-move condition of portable telephone), as will be discussed later in detail.

In such a case that after the counter 8 starts its counting operation and a preset constant time period (will be referred to as "stable condition continuous time" hereinafter) has elapsed, the counter 8 outputs the non-operation setting signal S16. This non-operation setting signal S16 is supplied to a selecting control input terminal of the selecting switch 9, and also the detecting circuit 2, the A/D converter 3, the adder 4, and the converting unit 5. In response to the non-operation setting signal S16, the selecting switch 9 switches the movable contacts in order to select the variable gain control signal S15 during the preceding control operation supplied from the latch circuit 6. As a consequence, the variable gain control signal S15 generated when the preceding control operation is carried out is entered via the selecting switch 9 and the D/A converter 10 into the gain control input terminal of the variable gain amplifier 1.

Since the non-operation setting signal S16 is entered, the detecting circuit 2, the A/D converter 3, the adder 4, and the converting unit 5 are set to the non-operation conditions, respectively. In this case, since the AGC closed-loop control system is not operated, while the amplifying gain of the variable gain amplifier 1 is maintained under preceding control condition, this variable gain amplifier 1 is continuously operated. As a consequence, as previously explained, the variable gain control signal S15 during the preceding control operation which is latched in the latch circuit 6 is employed so as to be inputted into the variable gain amplifier 1.

Next, after the counter 8 has outputted the non-operation setting signal S16, the counter 8 further counts present constant time (will be referred to as "operation stop continuous time" hereinafter). After this counting operation is ended, the counter 8 stops outputting of the non-operation setting signal S16. Since outputting of the non-operation setting signal S16 is stopped, the operations of the plural circuits defined from the detecting circuit 2 up to the converting unit 5 are restarted, and also the selecting switch 9 is switched to select the present variable gain control signal S15. This selected present variable gain control signal S15 is entered into the variable gain amplifier 1, so that the present operation is returned to the normal operation (AGC closed-loop control).

In this case, a description will now be made of both the stable condition continued time and the operation stop continued time, which are counted by the counter 8. The stable condition continued time corresponds to predetermined time used to judge that the reception electric field strength is constant and the reception-condition is stable, namely judges as to whether or not the automatic gain control condition is stable (namely under such a condition that variable gain control signal S15 supplied to variable gain amplifier 1 is constant, and is not changed). In this case, the output signal of the adder 7 is continued with having "0". For instance, when a portable telephone is put on a table and the like, namely non-move condition (i.e., when portable telephone is located at a fixed position), the above-described reception condition occurs. It should be noted that the stable condition continued time may be applied to any cases. That is, not only the reception electric field strength is high, but also the reception electric field strength is low, or intermediate. Namely, when the reception electric field strength becomes constant irrespective of the value thereof, the stable condition continued time may be applied.

In general, in the case that a portable telephone is brought into a waiting state, this portable telephone performs intermittent reception operation. At this time, while such an intermittent reception operation is carried out plural times (for example, 5 times), in such a reception condition that the automatic gain control condition becomes constant and the variable gain control signal S15 for the variable gain amplifier 1 is not changed, it is so judged that the stable condition continued time has elapsed. A first count value (for example, value corresponding to a preselected number of intermittent reception conditions) used to measure such stable condition continued time is set to the counter 8.

The operation stop continued time corresponds to the below-mentioned preselected time. That is, as explained above in the case that the automatic gain control condition becomes stable (namely, reception condition becomes stable), it is predictable that the variable gain control signal to the variable gain amplifier 1 is subsequently under constant condition. The operation of the AGC closed-loop control system is stopped for a time period which does not disturb the reception operation, for example, for a time period during which drop out of reception signals from a cell base station (namely, non-reception condition) is not increased. A second count value (for example, value corresponding to a preselected number of intermittent reception conditions) used to measure such operation stop continued time is set to the counter 8. For example, in such a case that a total time of this stable condition continued time is equal to 5 times of the intermittent reception operations, a total time of the operation stop continued time is equal to 2 times of the intermittent reception operations. In other words, both the stable condition continued time and the operation stop continued time are set in order that the portable telephone may be operated for a long operation time by adjusting the reception system, the power supply capacity, and the power consumption. The longer the operation stop continued time becomes, the greater the power consumption is decreased. As a consequence, it is desirable to prolong the operation stop continued time in order that the portable telephone using the rechargeable battery as the power supply can be operated for a longer time period.

Alternatively, it is also easily possible to arrange that both the stable condition continued time and the operation stop continued time are variably set. In this alternative case, a variable mode may be set by employing that a plurality of stable condition continued time and also a plurality of operation stop continued time, while adjusting the reception system and the operable time. As this variable mode, for instance, when a portable telephone is not moved for a long time period (when reception condition is stable for long time), the operation stop continued time may be set to be long. When moving of a portable telephone is frequently carried out (namely, when reception condition is unstable), the operation stop continued time is set to be short. Also, a ratio of the stable condition continued time to the operation stop continued time may be varied, depending upon the reception condition. As previously explained, since the operation stop control method is changed in response to the reception condition, more better reception performance can be obtained. The variable mode may be set by, for example, manipulating a function key and a ten key of a portable telephone, and also the variable mode and the fixed mode may be selectively set.

Next, a description will now be made of the circuits employed in the AGC closed-loop control system, which are set to the non-operation condition.

The detecting circuit 2, the A/D converter 3, the adder 4, and the converting unit 5 employed in the AGC closed-loop control system are arranged by circuits with employment of active elements. For instance, the circuit may be arranged by that while the non-operation setting signal S16 derived from the counter 8 is used as a negative pulse, the operation of this circuit is stopped by this negative pulse. The detecting circuit 2 is not arranged only by such a passive element as a diode and a capacitor, but may be arranged as an amplification type detecting circuit by employing a transistor and the like. This detecting circuit 2 may be brought into the non-operation condition by setting a bias thereof by using a negative pulse. This idea may be similarly applied to the A/D converter 3. Also, since both the adder 4 and the converting unit 5 are digital signal processing circuits, these circuits may be arranged in the form of a DSP (digital signal processor), and an MPU (main processor unit). As a result, the operations of these adder 4 and converting unit 5 may be controlled in such a manner that the operations thereof are stopped by receiving the non-operation setting signal S16. In this case, when the converting unit 5 is brought into the non-operation condition among the circuits employed in the AGC closed-loop control system, the highest power consumption reduction effects can be achieved.

It should be noted that in order to set the circuit to the non-operation condition, the circuit operation is stopped not only by supplying the control signal such as the non-operation setting signal S16, but also this circuit may be brought into the rest condition by stopping the supply of electric power to the circuit. Also, as to such a circuit whose rising operation is delayed among the circuits defined from the detecting circuit 2 up to the converting unit 5, the non-operation condition thereof is not set. In other words, setting of the non-operation condition must be selected in correspondence with the operation condition of the constructive circuit.

It should be noted that the above explanations about setting of the stable condition continued time, the operation stop continued time, and the non-operation condition to the various circuits defined from the detecting circuit 2 up to the converting unit 5 may be similarly applied to a second embodiment and a sixth embodiment. Therefore, the same explanations will be omitted.

As previously described, in accordance with the first embodiment, while the level of the variable gain control signal is employed as the condition detection level, in the case that the difference result of "0" is continued for a predetermined time period and this difference result of "0" is calculated between the variable gain control signal S15 during the preceding control operation, which is latched by the latch circuit 6, and the present variable gain control signal outputted from the converting unit 5, namely in such a case that the variable gain control signal S15 is not changed during a predetermined constant time (namely, stable condition continued time), the non-operation setting signal S16 is outputted from the counter 8. As a result, the various circuits employed in the AGC closed-loop-control system defined from the detecting circuit 2 up to the converting unit 5 are set to the non-operation conditions. Also, these circuits have been set to the non-operation conditions, and a preselected constant time period (operation stop continued time) has passed. Thereafter, the counter 8 stops to output the non-operation setting signal S16 in order that the operations of these circuits defined from the detecting circuit 2 to the converting unit 5 are recovered. As a result, the present automatic gain control operation is returned to the normal automatic gain control operation. Since such a gain control operation is carried out, the power consumption of the automatic gain control device can be reduced. In particular, when such an automatic gain control operation is applied to the portable telephone in which the rechargeable battery is used as the power supply, this portable telephone can be operated for a longer time period.

Second Embodiment

Figure 2:
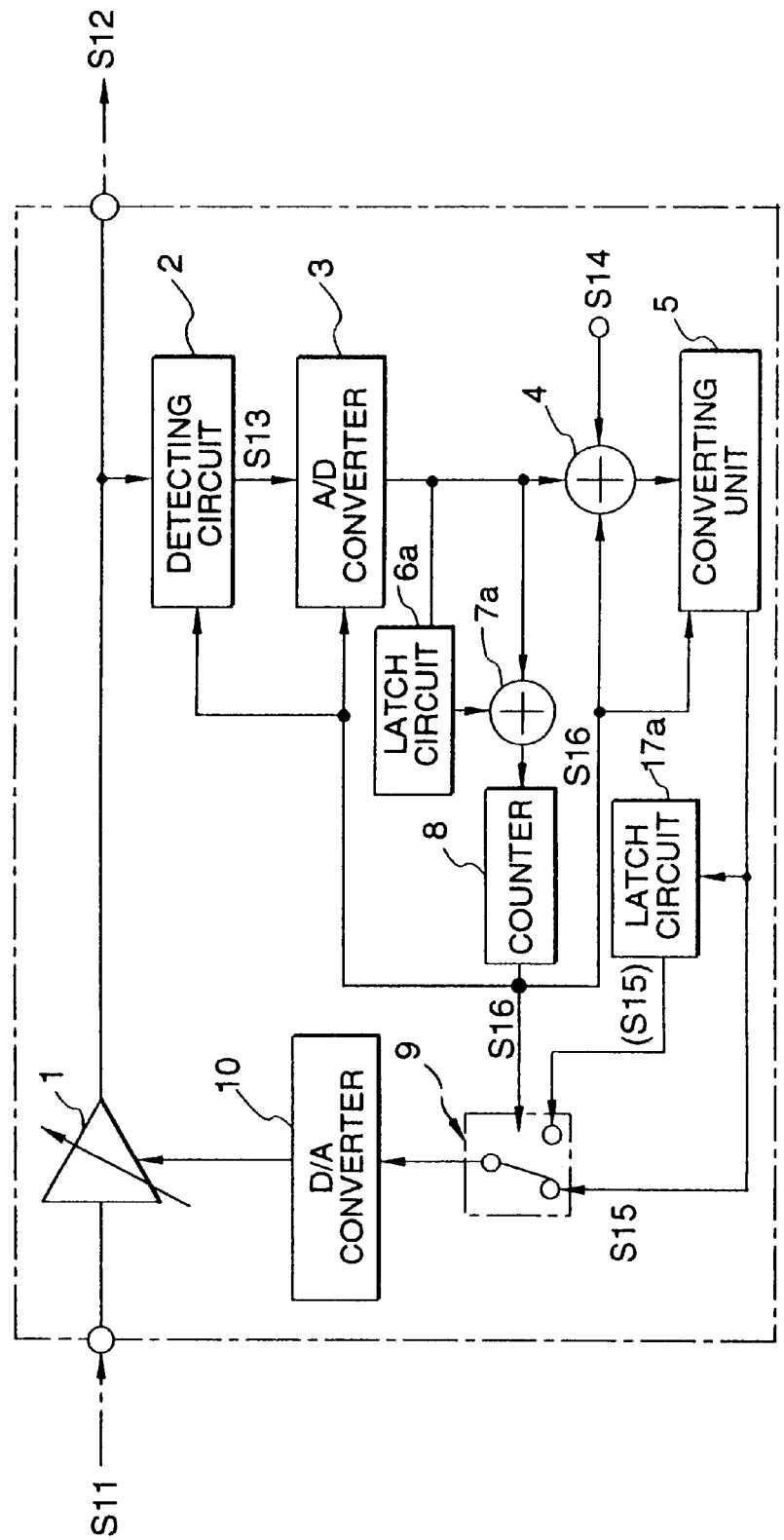
FIG. 2 is a block diagram for showing an arrangement of automatic gain control device/method according to a second embodiment of the present invention.

FIG. 2 is a block diagram for representing an arrangement of an automatic gain control device and an automatic gain control method, according to a second embodiment of the present invention.

The automatic gain control device, according to this second embodiment, is equipped with a variable gain amplifier operated in a similar manner to that of the previously explained first embodiment, and also a detecting circuit 2, an A/D converter 3, an adder 4, a converting unit 5, a counter 8, a selecting switch 9, and a D/A converter 10, which are employed as an AGC closed-loop control system.

Furthermore, as an arrangement featured in this second embodiment, this automatic gain control device is provided with a latch circuit 6a, an adder 7a, and another latch circuit 17a. The latch circuit 6a functions as a condition detection level holding means for holding/outputting a digitalized detection voltage S13 derived from the A/D converter 3. The adder 7a functions as a condition detection level difference calculating means for outputting a difference result signal between a detection voltage S13 during preceding control operation, which is supplied from this latch circuit 6a, and a present detection voltage S13 derived from the A/D converter 3. The latch circuit 17a holds a variable gain control signal S15 derived from the converting unit 5, and outputs the variable gain control signal S15 to the counter 8.

Next, operations of this automatic gain control device according to the second embodiment will now be described.

In FIG. 2, the AGC closed-loop control system of this second embodiment is basically operated in a similar manner to that of the first embodiment.

The output signal S12 which is generated by amplifying the input signal S11 is detected by the detecting circuit 2 to obtain the detection voltage S13. This detection voltage S13 is converted by the A/D converter 3 into a digital detection voltage which will be then applied to both the adder 4 and the latch circuit 6a. Then, the adder 7a calculates a difference between the detection voltage S13 during the preceding control operation, which is latched in the latch circuit 6a, and the present digitalized detection voltage outputted from the A/D converting unit 3, and then outputs this detection result signal the counter 8. Also, the adder 4 calculates a difference between the detection voltage S13 and the convergence value S14 to obtain a difference result signal. This adder 4 supplies this difference result signal to the converting unit 5 so as to generate the variable gain control signal S15.

The variable gain control signal S15 derived from the converting unit 5 is entered into one fixed contact of the selecting switch 9, and the input of the latch circuit 17a. Also, the variable gain control signal S15 during the preceding control operation, which is latched by the latch circuit 17a, is entered to the other fixed contact of the selecting switch 9. During the normal operation, the present variable gain control signal S15 outputted from the converting unit 5 is selected by the selecting switch 9, and then is entered into the D/A converter 10. Then, the selected variable gain control signal S15 is converted into an analog variable gain control signal by the D/A converter 10, and then, this analog variable gain control signal is entered into the gain control input terminal of the variable gain amplifier 1.

The counter 8 commences the counting operation when the difference result signal entered from the adder 7a into the counter 8 becomes "0", and continues the counting operation only when this difference result signal is equal to "0." This difference result signal become "0" in such a case that the detection voltage S13 is not changed, but becomes constant, in other word, when the strength of the reception electric field becomes constant, namely under stable condition (for example, non-move condition of portable telephone), similar to the case of using the variable gain control signal S15 of the first embodiment.

In such a case that after the counter 8 starts its counting operation and a preset stable condition continuous time has elapsed, the counter 8 outputs the non-operation setting signal S16. This non-operation setting signal S16 is supplied to a selecting control input terminal of the selecting switch 9, and also the detecting circuit 2, the A/D converter 3, the adder 4, and the converting unit 5. In response to the non-operation setting signal S16, the selecting switch 9 switches the movable contacts in order to select the variable gain control signal S15 during the preceding control operation supplied from the latch circuit 17a. As a consequence, the variable gain control signal S15 generated when the preceding control operation is carried out is entered via the selecting switch 9 and the D/A converter 10 into the gain control input terminal of the variable gain amplifier 1.

Since the non-operation setting signal S16 is entered, the detecting circuit 2, the A/D converter 3, the adder 4, and the converting unit 5 are set to the non-operation conditions, respectively, so that the operations are stopped. In this case, since the AGC closed-loop control system is not operated, while the amplifying gain of the variable gain amplifier 1 is maintained under preceding control condition, this variable gain amplifier 1 is continuously operated. As a consequence, as previously explained, the variable gain control signal S15 during the preceding control operation which is latched in the latch circuit 17a is employed so as to be inputted into the variable gain amplifier 1.

Next, after the counter 8 has outputted the non-operation setting signal S16, the counter 8 further counts preset operation stop continuous time. After this counting operation is ended, the counter 8 stops outputting of the non-operation setting signal S16. Since outputting of the non-operation setting signal S16 is stopped, the non-operation condition is released and thus the operations of the plural circuits defined from the detecting circuit 2 up to the converting unit 5 are restarted, and also the selecting switch 9 is switched to select the present variable gain control signal S15. This selected present variable gain control signal S15 is entered into the variable gain amplifier 1, so that the present operation is returned to the normal operation (AGC closed-loop control).

As previously described, in accordance with the second embodiment, while the voltage value of the detection signal is employed as the condition detection level, in the cause that the difference result of "0" is continued for a predetermined time period and this difference result of "0" is calculated between the detection voltage S13 during the preceding control operation, which is latched by the latch circuit 6a, and the present detection voltage S13, namely in such a case that detection voltage S13 is not changed during a predetermined constant time (namely, stable condition continued time), the non-operation setting signal S16 is outputted from the counter 8. As a result, the various circuits employed in the AGC closed-loop control system defined from the detecting circuit 2 up to the converting unit 5 are set to the non-operation conditions. Also, these circuits have been set to the non-operation conditions, and a preselected constant time period (operation stop continued time) has passed. Thereafter, the counter 8 stops to output the non-operation-setting signal S16 in order that the operations of these circuits defined from the detecting circuit 2 to the converting unit 5 are recovered. As a result, the present automatic gain control operation is returned to the normal automatic gain control operation. Since such a gain control operation is carried out, the power consumption of the automatic gain control device can be reduced similar to the first embodiment.

Third Embodiment

Figure 3:
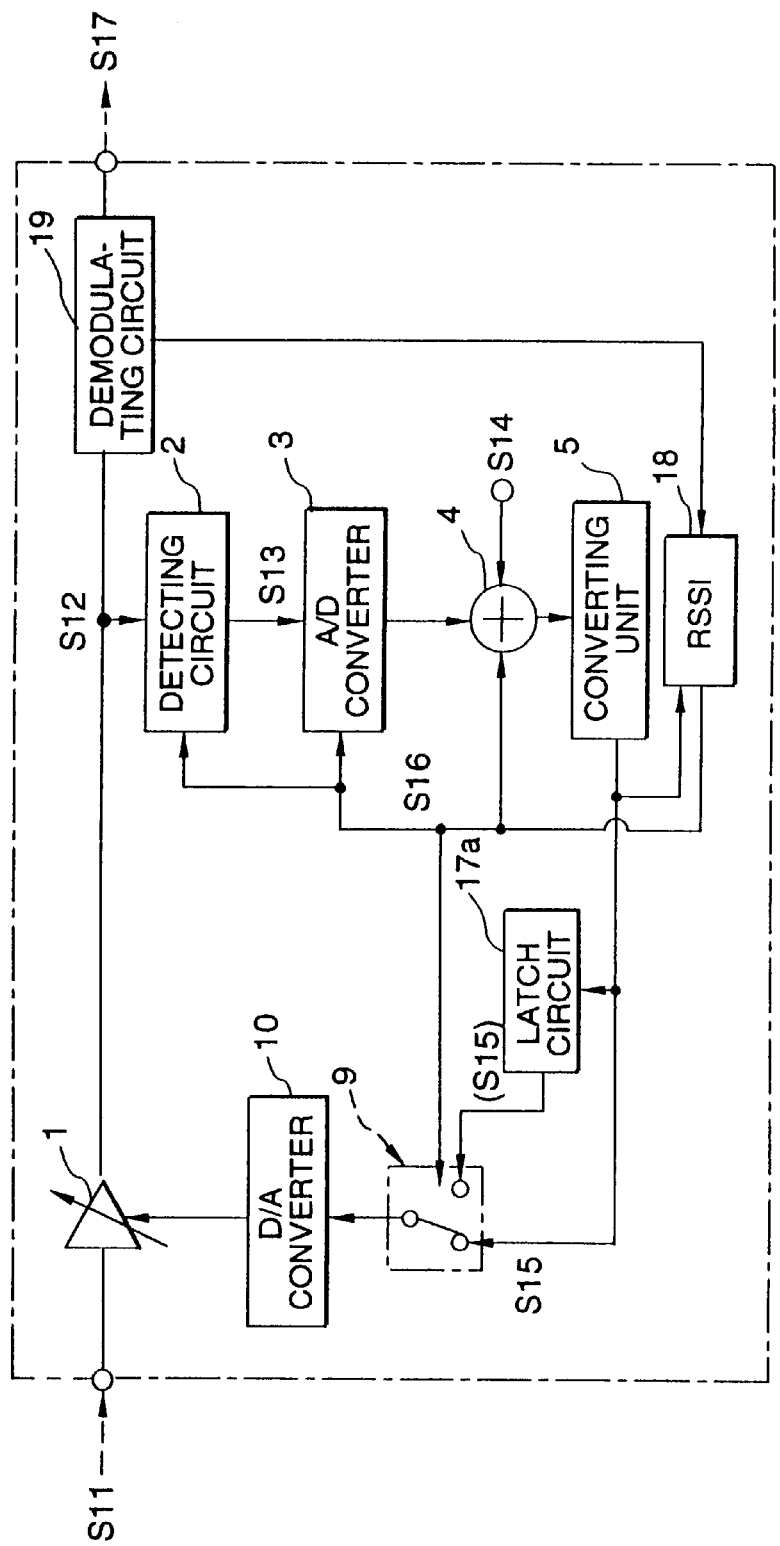
FIG. 3 is a block diagram for showing an arrangement of automatic gain control device/method according to a third embodiment of the present invention.

FIG. 3 is a block diagram for representing an arrangement of an automatic gain control device and an automatic gain control method, according to a third embodiment of the present invention.

The automatic gain control device, according to this third embodiment, is equipped with a variable gain amplifier 1 operated in a similar manner to that of the previously explained first embodiment, and also a detecting circuit 2, an A/D converter 3, an adder 4, a converting unit 5, a selecting switch 9, a D/A converter 10, and a latch circuit 17a which are employed as an AGC closed-loop control system.

Furthermore, as an arrangement featured in this third embodiment, this automatic gain control device is provided with a demodulating circuit 19 and an RSSI (RSSI: Received Signal Strength Indicator) 18. The demodulating circuit 19 demodulates an output signal S12 outputted from the variable gain amplifier 1 to generate a demodulation signal S17. The RSSI 18 functions as a received signal strength detecting means for detecting a received signal electric field strength based upon both the variable gain control signal S15 and the demodulation signal S17 outputted from the demodulating circuit 19.

Next, operations of this automatic gain control device according to the third embodiment will now be described.

In FIG. 3, the output signal S12 which is generated by variable-gain-amplifying the input signal S11 in the variable gain amplifier is detected by the detecting circuit 2 to obtain the detection voltage S13. This detection voltage S13 is converted by the A/D converter 3 into a digital detection voltage which will be then applied to the adder 4. Also, the adder 4 calculates a difference between the detection voltage S13 and the convergence value S14 to obtain a difference result signal. This adder 4 supplies this difference result signal to the converting unit 5 so as to generate the variable gain control signal S15. The variable gain control signal S15 derived from the converting unit 5 is entered into one fixed contact of the selecting switch 9, and the input of the latch circuit 17a. Also, the variable gain control signal S15 during the preceding control operation, which is latched by the latch circuit 17a, is entered to both the other fixed contact of the selecting switch 9. During the normal operation, the present variable gain control signal S15 outputted from the converting unit 5 is selected by the selecting switch 9, and then,is entered into the D/A converter 10. Then, the selected variable gain control signal S15 is converted into an analog variable gain control signal by the D/A converter 10, and then, this analog variable gain control signal is entered into the gain control input terminal of the variable gain amplifier 1.

Also, the demodulating circuit 19 demodulates the output signal S12 derived from the variable gain amplifier 1 to output the demodulation signal S17. The RSSI 18 detects a received signal electric field strength (corresponding to signal level of input signal S11) based upon both the variable gain control signal S15 supplied from the converting unit 5 and the demodulation signal S17 derived from the demodulating circuit 19.

In such a case that the received signal electric field strength is not changed during preset stable condition continued time, the RSSI 18 outputs a non-operation setting signal S16. This non-operation setting signal S16 is sent to a selecting control input terminal of the selecting switch 9, and also the detecting circuit 2, the A/D converter 3, and the adder 4. In response to the non-operation setting signal S16, the selecting switch 9 switches the movable contacts in order to select the variable gain control signal S15 during the preceding control operation supplied from the latch circuit 17a. As a consequence, the variable gain control signal S15 generated when the preceding control operation is carried out is entered via the selecting switch 9 and the D/A converter 10 into the gain control input terminal of the variable gain amplifier 1.

Since the non-operation setting signal S16 is entered, the detecting circuit 2, the A/D converter 3, and the adder 4 are set to the non-operation conditions, respectively, so that the operations are stopped. In this case, since the AGC closed-loop control system is not operated, while the amplifying gain of the variable gain amplifier 1 is maintained under preceding control condition, this variable gain amplifier 1 is continuously operated. As a consequence, as previously explained, the variable gain control signal S15 during the preceding control operation which is latched in the latch circuit 17a is employed so as to be inputted into the variable gain amplifier 1.

Next, after the RSSI 18 has outputted the non-operation setting signal S16, and the preset operation stop continuous time has passed, the RSSI 18 stops outputting of the non-operation setting signal S16. Since outputting of the non-operation setting signal S16 is stopped, the operations of the plural circuits defined from the detecting circuit 2 up to the adder 4 are restarted, and also the selecting switch 9 is switched to select the present variable gain control signal S15. This selected present variable gain control signal S15 is entered into the variable gain amplifier 1, so that the present operation is returned to the normal operation (AGC closed-loop control).

As previously described, in accordance with the third embodiment, while the received signal electric field strength is employed as the condition detection level, in such a case that the received signal electric field strength detected by the RSSI 18 is not changed during a predetermined constant time (namely, stable condition continued time), the non-operation setting signal S16 is outputted. As a result, the various circuits employed in the AGC closed-loop control system defined from the detecting circuit 2 up to the adder 4 are set to the non-operation conditions. Also, these circuits have been set to the non-operation conditions and a preselected constant time period (operation stop continued time) has passed. Thereafter, the counter 8 stops to output the non-operation setting signal S16 in order that the operations of these circuits defined from the detecting circuit 2 to the adder 4 are recovered. As a result, the present automatic gain control operation is returned to the normal automatic gain control operation. Since such a gain control operation is carried out, the power consumption of the automatic gain control device can be reduced similar to the first embodiment.

Fourth Embodiment

Figure 4:
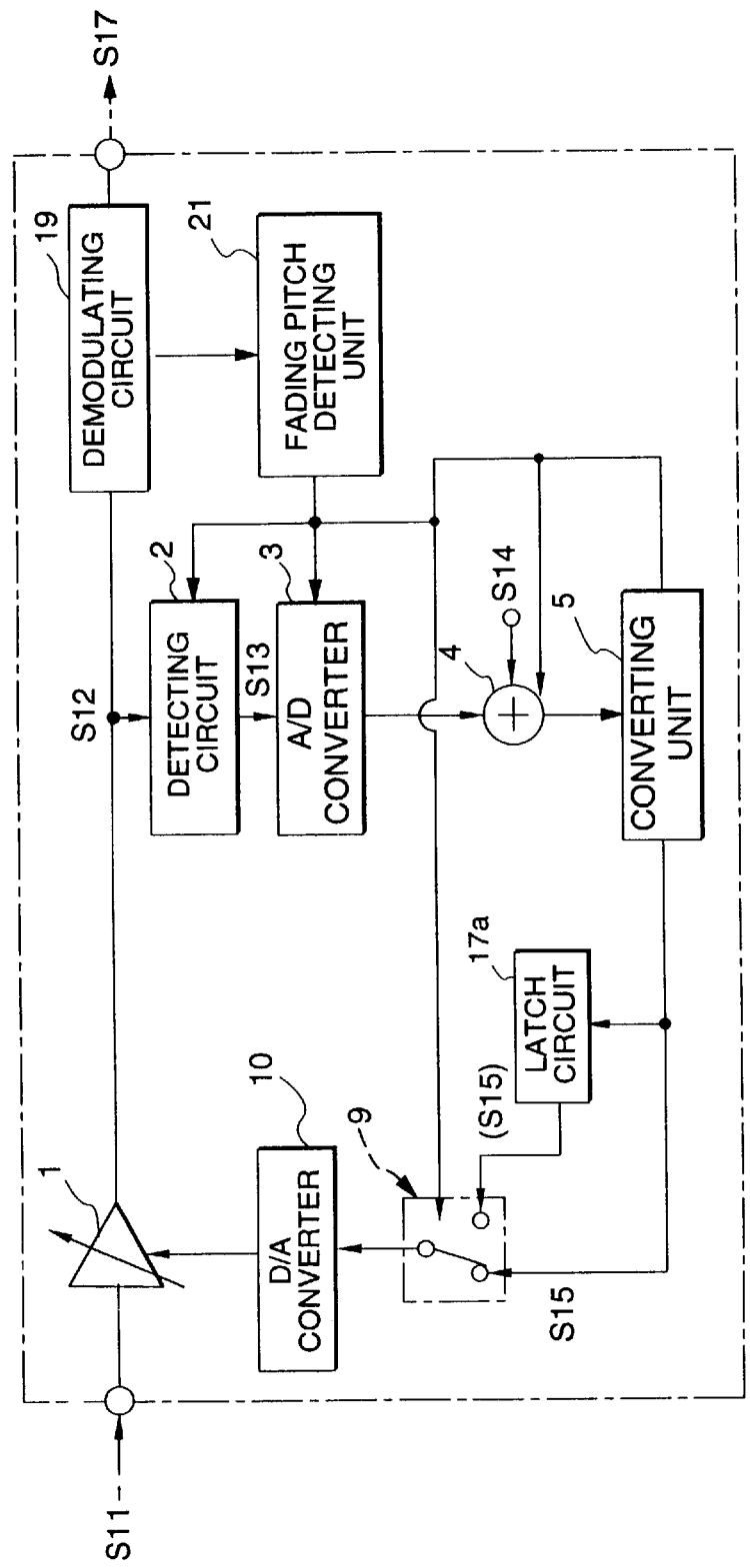
FIG. 4 is a block diagram for showing an arrangement of automatic gain control device/method according to a fourth embodiment of the present invention.

FIG. 4 is a block diagram for representing an arrangement of an automatic gain control device and an automatic gain control method, according to a fourth embodiment of the present invention.

The automatic gain control device, according to this fourth embodiment, is equipped with a variable gain amplifier 1 operated in a similar manner to that of the previously explained first embodiment to third embodiment, and also a detecting circuit 2, an A/D converter 3, an adder 4, a converting unit 5, a selecting switch 9, a D/A converter 10, a latch circuit 17a, and a demodulating circuit 19 which are employed as an AGC closed-loop control system.

Furthermore, as an arrangement featured in this fourth embodiment, this automatic gain control device is provided with a fading pitch detecting unit 21. The fading pitch detecting unit 21 functions as a fading pitch detecting means for detecting a fading pitch (fading frequency) from an demodulation signal S17 outputted from the demodulating circuit 19.

Next, operations of this automatic gain control device according to the fourth embodiment will now be described.

In FIG. 4, the output signal S12 which is generated by variable-gain-amplifying the input signal S11 by the variable gain amplifier 1 is detected by the detecting circuit 2 to obtain a detection voltage S13. This detection voltage S13 is A/D-converted by the A/D converter 3 into a digital detection voltage which will be then inputted to the adder 4. This adder 4 calculates a difference between the detection voltage S13 and the convergence value S14 so as to obtain a difference result signal. This difference result signal is outputted to the converting unit 5 in order to generate the variable gain control signal S15. The variable gain control signal S15 derived from the control unit 5 is entered into one fixed contact of the selecting switch 9, and the input of the latch circuit 17a. Also, the variable gain control signal S15 during the preceding control operation, which is latched by the latch circuit 17a, is entered to the other fixed contact of the selecting switch 9. During the normal operation, the present variable gain control signal S15 outputted from the converting unit 5 is selected by the selecting switch 9, and then is entered into the D/A converter 10. Then, the selected variable gain control signal S15 is converted into an analog variable gain control signal by the D/A converter 10, and then, this analog variable gain control signal is entered into the gain control input terminal of the variable gain amplifier 1.

Also, the demodulating circuit 19 demodulates the output signal S12 derived from the variable gain amplifier 1 to output the demodulation signal S17. The facing pitch detecting unit 21 detects a fading pitch based on the demodulation signal S17 derived from the demodulating circuit 19. This fading pitch corresponds to a total changing number of signal levels of reception signals per unit time, and indicates a move velocity of a reception apparatus.

The fading pitch detecting unit 21 outputs the non-operation setting signal S16 in the case that a 0-Hz state of the fading pitch is continued for a preset stable condition continued time (namely, under stable reception condition in which reception electric field strength is constant). This non-operation setting signal S16 is supplied to a selecting control input terminal of the selecting switch 9, and also the detecting circuit 2, the A/D converter 3, the adder 4, and the converting unit 5. In response to the non-operation setting signal S16, the selecting switch 9 switches the movable contacts in order to select the variable gain control signal S15 during the preceding control operation supplied from the latch circuit 17a. As a consequence, the variable gain control signal S15 generated when the preceding control operation is carried out is entered via the selecting switch 9 and the D/A converter 10 into the gain control input terminal of the variable gain amplifier 1.

Since the non-operation setting signal S16 is entered, the detecting circuit 2, the A/D converter 3, the adder 4, and the converting unit 5 are set to the non-operation conditions, respectively, so that the operations are stopped. In this case, since the AGC closed-loop control system is not operated, while the amplifying gain of the variable gain amplifier 1 is maintained under preceding control condition, this, variable gain amplifier 1 is continuously operated. As a consequence, as previously explained, the variable gain control signal S15 during the preceding control operation which is latched in the latch circuit 17a is employed so as to be inputted into the variable gain amplifier 1.

Next, after the fading pitch detecting unit 21 has outputted the non-operation setting signal S16, and the present operation stop continuous time has passed, this fading pitch detecting unit 21 stops outputting of the non-operation setting signal S16. Since outputting of the non-operation setting signal S16 is stopped, the operations of the plural circuits defined from the detecting circuit 2 up to the converting unit are restarted, and also the selecting switch 9 is switched to select the present variable gain control signal S15. This selected present variable gain control signal S15 is entered into the variable gain amplifier 1, so that the present operation is returned to the normal operation (AGC closed-loop control).

As previously explained, in accordance with the fourth embodiment, while the fading pitch is employed as the condition detection value, the fading pitch detecting unit 21 outputs the non-operation setting signal S16 in such a case that the 0-Hz state of the fading pitch detected by this fading pitch detecting unit 21 is continued during preset constant time (namely, stable condition continued time). As a result, the various circuits employed in the AGC closed-loop control system defined from the detecting circuit 2 up to the converting unit 5 are set to the non-operation conditions. Also, these circuits have been set to the non-operation conditions, and a preselected constant time period (operation stop continued time) has passed. Thereafter, the fading pitch detecting unit 21 stops to output the non-operation setting signal S16 in order that the operations of these circuits defined from the detecting circuit 2 to the converting unit 5 are recovered. As a result, the present automatic gain control operation is returned to the normal automatic gain control operation. Since such a gain control operation is carried out, the power consumption of the automatic gain control device can be reduced similar to the first embodiment.

Fifth Embodiment

Figure 5:
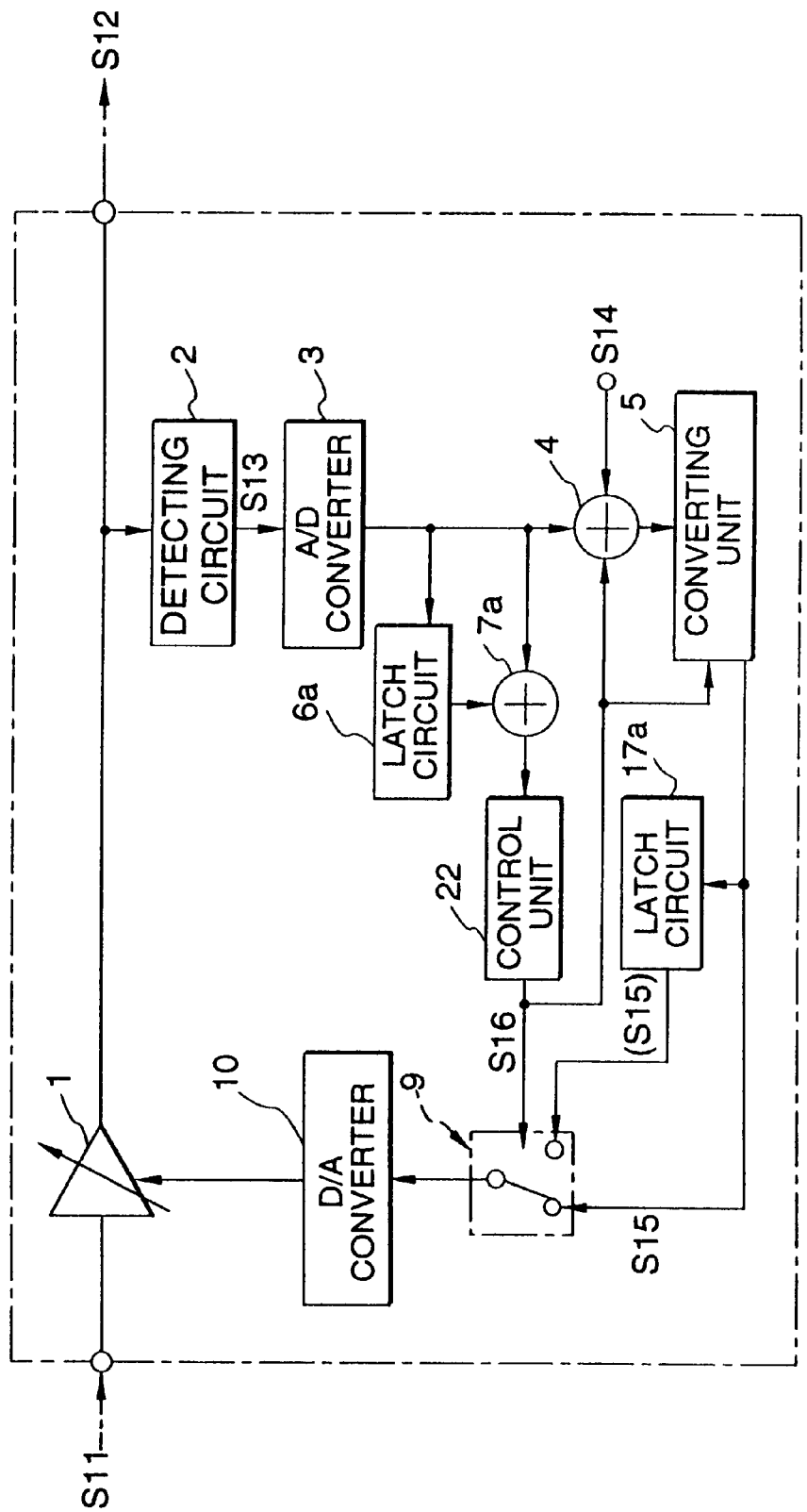
FIG. 5 is a block diagram for showing an arrangement of automatic gain control device/method according to a fifth embodiment of the present invention.

FIG. 5 is a block diagram for representing an arrangement of an automatic gain control device and an automatic gain control method, according to a fifth embodiment of the present invention.

The automatic gain control device, according to this fifth embodiment, is equipped with a variable gain amplifier 1 operated in a similar manner to that of the previously explained first embodiment and second embodiment, and also a detecting circuit 2, an A/D converter 3, an adder 4, a converting unit 5, a latch circuit 6a, an adder 7a, a selecting switch 9, a D/A converter 10, and another latch circuit 17a, which are employed as an AGC closed-loop control system.

Furthermore, as an arrangement featured in this fifth embodiment, this automatic gain control device is provided with a control unit 22. This control unit 22 functions as an operation control means. When a difference result signal between a detection voltage S13 latched by the latch circuit 6a and a present detection voltage S13 becomes "0", this operation control means outputs a non-operation setting signal S16 to the selecting switch 9, the adder 4, and the converting unit 5 so as to set a non-operation condition, and also when this difference result signal is not equal to "0", the operation control means stops outputting of the non-operation setting signal S16.

Next, operations of this automatic gain control device according to the fifth embodiment will now be described.

In FIG. 5, the output signal S12 which is generated by variable-gain-amplifying the input signal S11 by the variable gain amplifier 1 is detected by the detecting circuit 2 to obtain a detection voltage S13. This detection voltage S13 is A/D-converted by the A/D converter 3 into a digital detection voltage which will be then inputted to the adder 4 and the latch circuit 6a. The adder 7a calculates a difference between the detection voltage S13 during the preceding control operation, which is latched in the latch circuit 6a, and the present digitalized detection voltage outputted from the A/D converting unit 3, and then outputs this difference result signal to the control unit 22. Also, the adder 4 calculates a difference between the detection voltage S13 and the convergence value S14 to obtain a difference result signal. This adder 4 supplies this difference result signal to the converting unit 5 so as to generate the variable gain control signal S15.

The variable gain control signal S15 derived from the converting unit 5 is entered into one fixed contact of the selecting switch 9, and the input of the latch circuit 17a. Also, the variable gain control signal S15 during the preceding control operation, which is latched by the latch circuit 17a, is entered to the other fixed contact of the selecting switch 9. During the normal operation, the present variable gain control signal S15 outputted from the converting unit 5 is selected by the selecting switch 9, and then is entered into the D/A converter 10. Then, the selected variable gain control signal S15 is converted into an analog variable gain control signal by the D/A converter 10, and then, this analog variable gain control signal is entered into the gain control input terminal of the variable gain amplifier 1.

When the difference result signal inputted from the added 7a becomes "0", the control unit 22 outputs the non-operation setting signal S16. This non-operation setting signal S16 is supplied to a selecting control input terminal of the selecting switch 9, and also the adder 4 and the converting unit 5. In response to the non-operation setting signal S16, the selecting switch 9 switches the movable contacts in order to select the variable gain control signal S15 during the preceding control supplied from the latch circuit 17a. As a consequence, the variable gain control signal S15 generated when the preceding control operation is carried out is entered via the selecting switch 9 and the D/A converter 10 into the gain control input terminal of the variable gain amplifier 1.

Since the non-operation setting signal S16 is entered, both the adder 4 and the converting unit 5 are set to the non-operation conditions respectively, so that the operations are stopped. In this case, since the AGC closed-loop control system is not operated, while the amplifying gain of the variable gain amplifier 1 is maintained under preceding control condition, this variable gain amplifier 1 is continuously operated. As a consequence, as previously explained, the variable gain control signal S15 during the preceding control operation which is latched in the latch circuit 17a is employed so as to be inputted into the variable gain amplifier 1.

On the other hand, when the difference result signal entered from the adder 7a is not equal to "0", the control unit 22 stops outputting of the non-operation setting signal S16. Since outputting of the non-operation setting signal S16 is stopped, the non-operation condition is released, and the operations of the plural circuits defied from the adder 4 up to the converting unit 5 are restarted, and also the selecting switch 9 is switched to select the present variable gain control signal S15. This selected present variable gain control signal S15 is entered into the variable gain amplifier 1, so that the present operation is returned to the normal operation (AGC closed-loop control).

As previously explained, in the automatic gain control device of the fifth embodiment, the detecting circuit 2, the A/D converter 3, the latch circuit 6a, and the adder 7a are operated in the continuous manner. Then, when the difference result between the detection voltage S13 generated during the preceding control operation and the present detection voltage S13 is equal to "0", namely when the detection voltage S13 is not changed, the control unit 22 outputs the non-operation setting signal S16 in order that both the adder 4 and the converting unit 5 employed in the AGC closed-loop control system are set to the non-operation condition. When the above-explained difference result becomes any number other than "0", the control unit 22 stops to output the non-operation setting signal S16. As a result, the operation of the AGC closed-loop control system is recovered, and the normal automatic gain control operation is returned. Since such an operation control is carried out by the control unit 22, the power consumption of the automatic gain control device can be reduced in a similar manner to the first embodiment. More specifically, it is possible to realize such an automatic gain control device capable of reducing the power consumption thereof, while executing the automatic gain control operation in higher precision, as compared with that of the second embodiment.

Sixth Embodiment

Figure 6:
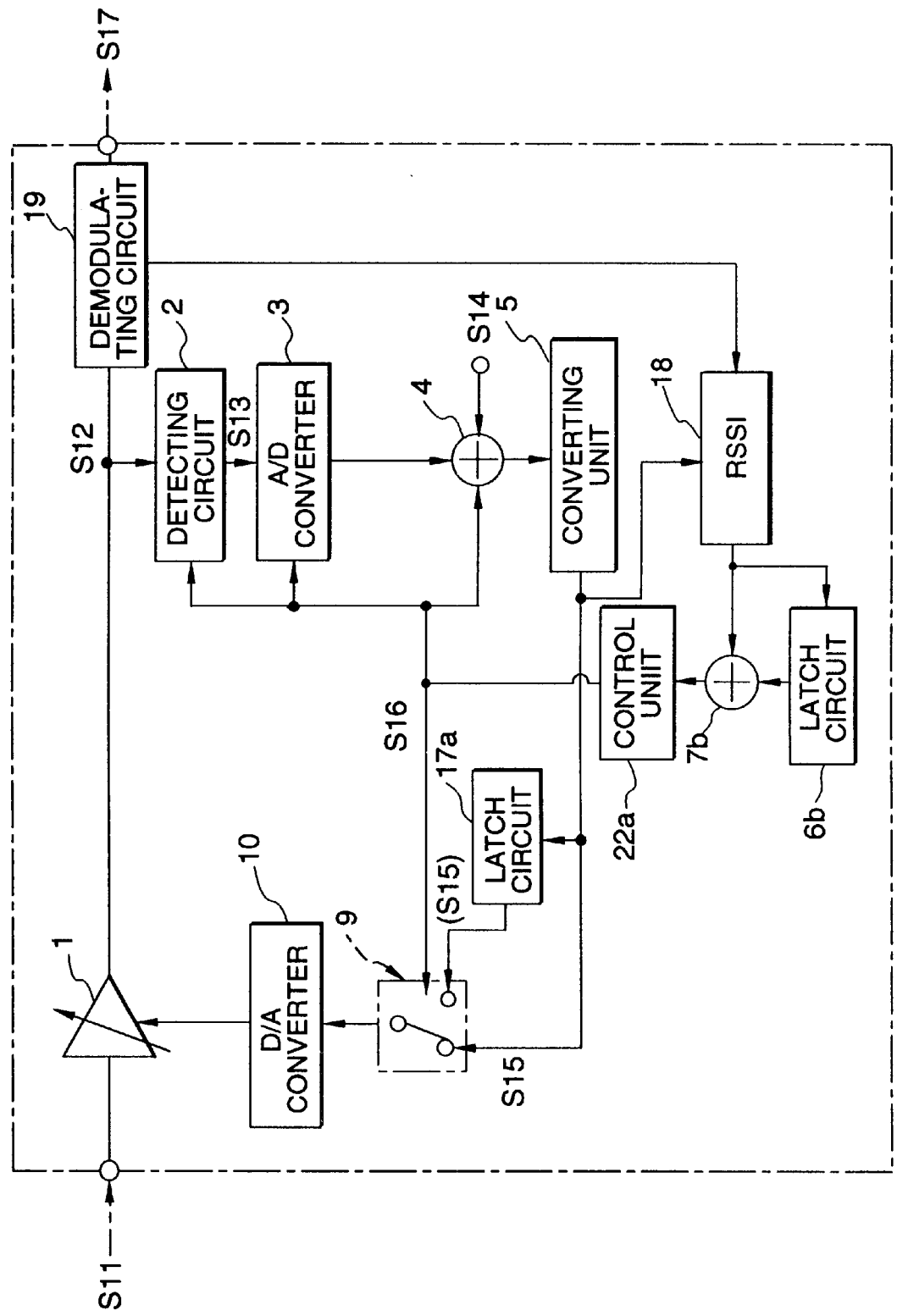
FIG. 6 is a block diagram for showing an arrangement of automatic gain control device/method according to a sixth embodiment of the present invention.

FIG. 6 is a block diagram for representing an arrangement of an automatic gain control device and an automatic gain control method, according to a sixth embodiment of the present invention.

The automatic gain control device, according to this sixth embodiment, is equipped with a variable gain amplifier 1 operated in a similar manner to that of the previously explained first embodiment and the third embodiment, and also a detecting circuit 2, an A/D converter 3, an adder 4, a converting unit 5, a selecting switch 9, a D/A converter 10, a latch circuit 17a, and an RSSI 18, which are employed as an AGC closed-loop control system.

Furthermore, as an arrangement featured in this sixth embodiment, this automatic gain control device is provided with a latch circuit 6b, an adder 7b, and a control unit 22. The latch circuit 6b holds/outputs a received signal electric field strength outputted from the RSSI 18. The adder 7b outputs a difference result signal between a previously-detected the received signal electric field strength latched in the latch circuit 6b and a presently-detected the received signal electric field strength. The control unit 22a functions as an operation control means for outputting a non-operation setting signal S16 when the difference result signal derived from the adder 7b is equal to "0".

Next, operations of this automatic gain control device according to the sixth embodiment will now be described.

In FIG. 6, the output signal S12 which is generated by variable-gain-amplifying the input signal S11 by the variable gain amplifier 1 is detected by the detecting circuit 2 to obtain a detection voltage S13. This detection voltage S13 is A/D-converted by the A/D converter 3 into a digital detection voltage which will be then inputted to the adder 4. This adder 4 calculates a difference between the detection voltage S13 and the convergence value S14 so as to obtain a difference result signal. This difference result signal is outputted to the converting unit 5 in order to generate the variable gain control signal S15.

The variable gain control signal S15 derived from the converting unit 5 is entered into one fixed contact of the selecting switch 9, and the input of the latch circuit 17a. Also, the variable gain control signal S15 during the preceding control operation, which is latched by the latch circuit 17a, is entered to the other fixed contact of the selecting switch 9. During the normal operation, the present variable gain control signal S15 outputted from the converting unit 5 is selected by the selecting switch 9, and then is entered into the D/A converter 10. Then, the selected variable gain control signal S15 is converted into an analog variable gain control signal by the D/A converter 10, and then, this analog variable gain control signal is entered into the gain control input terminal of the variable gain amplifier 1.

Also, the demodulating circuit 19 demodulates the output signal S12 supplied from the variable gain amplifier 1 to output a demodulation signal S17. The RSSI 18 detects a received signal electric field strength based upon both the variable gain control signal S15 derived from the converting unit 5 and the demodulation signal S17 derived from the demodulating circuit 19, and then outputs this detected field strength as a received signal electric field strength. This detected received signal electric field strength is entered to both the latch circuit 6b and the adder 7b. The adder 7b calculates a difference level between the previously-detected received signal electric field strength latched in the latch circuit 6b and the presently-detected received signal electric field strength to output a difference result signal to the control unit 22a.

When the difference result signal entered from the adder 7b into this control unit 22a is equal to "0", the control unit 22a outputs the non-operation setting signal S16. This non-operation setting signal S16 is supplied to a selecting control input terminal of the selecting switch 9, and also the detecting circuit 2, the A/D converter 3, and the adder 4. In response to the non-operation setting signal S16, the selecting switch 9 switches the movable contacts in order to select the variable gain control signal S15 during the preceding control supplied from the latch circuit 17a. As a consequence, the variable gain control signal generated when the preceding control operation is carried out is entered via the selecting switch 9 and the D/A converter 10 into the gain control input terminal of the variable gain amplifier 1.

Since the non-operation setting signal S16 is entered, the detecting circuit 2, the A/D converter 3, and the adder 4 are et to the non-operation conditions, respectively, so that the operations are stopped. In this case, since the AGC closed-loop control system is not operated, while the amplifying gain of the variable gain amplifier 1 is maintained under preceding control condition, this variable gain amplifier 1 is continuously operated. As a consequence, as previously explained, the variable gain control signal S15 during the preceding control operation which is latched in the latch circuit 17a is employed so as to be inputted into the variable gain amplifier 1.

On the other hand, when the difference result signal entered from the adder 7b is not equal to "0", the control unit 22a stops to output the non-operation setting signal S16. Since outputting of the non-operation setting signal S16 is stopped, the operations of the plural circuits defined from the detecting circuit 2 up to the adder 4 are restarted, and also the selecting switch 9 is switched to select the present variable gain control signal S15. This selected present variable gain control signal S15 is entered into the variable gain amplifier 1, so that the present operation is returned to the normal operation (AGC closed-loop control).

As previously explained, in this sixth embodiment, while the RSSI 18 continuously detects the received signal electric field strength, in such a case that the difference result between the previously-detected received signal electric field strength and the presently-detected received signal electric field strength is equal to "0", namely when the received signal electric field strength is not changed, the control unit 22a outputs the non-operation setting signal S16 in order to set the plural circuits defined from the detecting circuit 4 up to the adder 4 employed in the AGC closed-loop control system into the non-operative conditions. When the above-explained difference result becomes any number other than "0" the control unit 22 stops to output the non-operation setting signal S16. As a result, the operation of the AGC closed-loop control system is recovered, and the normal automatic gain control operation is returned. Since such an operation control is carried out by the control unit 22, the power consumption of the automatic gain control device can be reduced in a similar manner to the first embodiment. More specifically, it is possible to realize such an automatic gain control device capable of reducing the power consumption thereof, while executing the automatic gain control operation in higher precision, as compared with that of the third embodiment.

As previously explained, in accordance with the automatic gain control device of the embodiments, in the case that the condition of the input signal becomes stable and thus the automatic gain control condition becomes stable, the operations of the circuits employed in the automatic gain control system are stopped. In other words, when the variable gain control signal, the detection voltage, the received signal electric field strength, and the fading pitch become constant for a preselected time period and are not changed, the operations of these circuits of this automatic gain control system are stopped. As a result, while the automatic gain control operations is executed in high precision, the power consumption can be reduced. In particular, when such an automatic gain control operation is applied to the portable telephone in which the rechargeable battery is used as the power supply, this portable telephone can be operated for a longer time period.

As previously described in detail, in accordance with the present invention, when the signal is variable-gain-amplified by the variable gain amplifying means to obtain a predetermined output signal, as the condition detection level detected based upon the input signal, while any one of the following levels is employed, i.e., the level of the variable gain control signal; the level of the detection signal generated by detecting the output signal; the reception electric field strength of the input signal detected based upon the output signal; and the fading pitch of the input signal detected based on the output signal, a change in this condition detecting level is detected. When this condition detection level is not changed for a preselected time period, at least a portion of the circuits provided in this automatic gain control system is brought into the non-operation condition. When the circuits are set to this non-operation condition, the held variable gain control signal is sent out to the variable gain amplifying means. As a consequence, there is such an advantage that even when the automatic gain control operation is carried out, the power consumption can be reduced. Therefore, it is possible to provide the automatic gain control device and method, and also the radio communication apparatus having the automatic gain control function, which can be operated for the long operation period.

What is claimed is:

1. An automatic gain control device in which an input signal is variable-amplified by a variable gain amplifier in order to obtain a predetermined output signal, which comprises:

a control signal generating means which generates a variable gain control signal in response to an output signal level of said variable gain amplifier;

a control signal holding means which holds the variable gain control signal; and an operation controlling means for bringing at least a circuit of the automatic gain control device into a non-operative operative condition if a condition detecting level based upon the input signal is not changed for a predetermined time period, and for sending out the variable gain control signal held by said control signal holding means to said variable gain amplifier under the non-operative condition.

2. The automatic gain control device as claimed in claim 1, wherein a level of the variable gain control signal is used as the condition detecting level.

3. The automatic gain control device as claimed in claim 1, further comprising a detecting means which detects the output signal in order to obtain a detection signal, wherein a level of the detection signal is used as the condition detecting level.

4. The automatic gain control device as claimed in claim 1, further comprising a received electric field strength detecting means which detects a received electric field strength of the input signal based on the output signal, wherein a level of the received electric field strength is used as the condition detecting level.

5. The automatic gain control device as claimed in claim 1, further comprising a fading pitch detecting means which detects a fading pitch of an input signal based on the output signal, wherein the fading pitch is used as the condition detecting level.

6. An automatic gain control device in which an input signal is variable-amplified by a variable gain amplifier in order to obtain a predetermined output signal, which comprises:

a control signal generating means which generates a variable gain control signal in response to the output signal level of said variable gain amplifier;

a control signal holding means which holds the variable gain control signal;

a condition detection level holding means which holds a condition detecting level in response to the input signal;

a condition detecting level difference calculating means which calculates a difference between a preceding condition detection level which are held by said condition detecting level holding means, and a present condition detection level; and operation controlling means which brings at least a circuit of the automatic gain control device into a non-operative condition in the case that the difference of said condition detection level is equal to zero, and for sending out the variable gain control signal held by said control signal holding means to said variable gain amplifier under said non-operative condition, and also for releasing the non-operative condition of the circuit of the automatic gain control device when the difference of said condition detecting level is not equal to zero.

7. The automatic gain control device as claimed in claim 1, wherein a level of the variable gain control signal is used as the condition detecting level.

8. The automatic gain control device as claimed in claim 1, further comprising a detecting means which detects the output signal in order to obtain a detection signal, wherein a level of the detection signal is used as the condition detecting level.

9. The a automatic gain control device as claimed in claim 1, further comprising a received electric field detecting means which detects a received electric field strength of an input signal based on the output signal, wherein a level of the received electric field is used as the condition detecting level.

10. The automatic gain control device as claimed in claim 1, further comprising a fading pitch detecting means which detects a fading pitch of an input signal based on the output signal, wherein the fading pitch is used as the condition detecting level.

11. An automatic gain control method in which an input signal is variable-amplified by a variable gain amplifier in order to obtain a predetermined output signal, which comprises steps of:

generating a variable gain control signal in response to an output signal level of said variable gain amplifier;

holding the variable gain control signal; and bringing at least a circuit of the automatic gain control device into a non-operative condition if a condition detecting level based upon the input signal is not changed for a predetermined time period, and for sending out the variable gain control signal held by said control signal holding means to said variable gain amplifier under the non-operative condition.

12. The automatic gain control method as described in claim 11, wherein one of a level of the variable gain control signal, a level of the detection signal generated by detecting the output signal, a level of received signal electric field strength of an input signal detected based upon the output signal, and a fading pitch of an input signal detected based on the output signal, is used as the condition detecting level.

13. An automatic gain control method comprising steps of:

generating a variable gain control signal in response to the output signal level of said variable gain amplifier;

holding the variable gain control signal;

holding a condition detecting level in response to the input signal;

calculating a difference between a preceding condition detection level which are held by said condition detecting level holding means, and a present condition detection level; and bringing at least a circuit of the automatic gain control device into a non-operative condition if the difference of said condition detection level is equal to zero, and for sending out the variable gain control signal held by said control signal holding means to said variable gain amplifier under said non-operative condition, and also for releasing the non-operative condition of the circuit of the automatic gain control device when the difference of said condition detecting level is not equal to zero.

14. The automatic gain control method as described in claim 13, wherein one of a level of the variable gain control signal, a level of the detection signal generated by detecting the output signal, a level of received signal electric field strength of the input signal detected based upon the output signal, and a fading pitch of the input signal detected based on the output signal, is used as the condition detecting level.

15. A radio communication apparatus comprising:

an automatic gain control device provided in a received system of said radio communication apparatus, which includes:

a control signal generating means which generates a variable gain control signal in response to an output signal level of said variable gain amplifier;

a control signal holding means which holds the variable gain control signal; and an operation controlling means which brings at least a circuit of the automatic gain control device into a non-operative condition if a condition detecting level based upon the input signal is not changed for a predetermined time period, and for sending out the variable gain control signal held by said control signal holding means to said variable gain amplifier under the non-operative condition.

* * * * *

UNITED STATES PATENT AND TRADEMARK OFFICE
CERTIFICATE OF CORRECTION

PATENT NO. : 6,577,852 B1
DATED : June 10, 2003
INVENTOR(S) : Yasushi Iwata et al.

It is certified that error appears in the above-identified patent and that said Letters Patent is hereby corrected as shown below:

Column 1,
Line 25, please delete "attenuate ions", and insert therefor -- attenuations --.

Column 7,
Line 25, please delete the paragraph which begins "Also, in the adder 7...", and ends at column 7, line 38 which concludes "...as will be discussed later in detail.", and insert the following paragraph therefor:
-- Also, in the adder 7, a calculation is made of a difference between the variable gain control signal S15 during the preceding control operation, which is latched by the latch circuit 6, and the present variable gain control signal S15 derived from the converting unit 5. The resulting difference result signal is outputted to the counter 8. The counter 8 commences the counting operation when the difference result signal entered into the counter 8 becomes "0", and continues the counting operation only when this difference result signal is equal to "0." This difference result signal become "0" in such a case that the variable gain control signal S15 is not changed, but becomes constant, in other word, when the strength of the reception electric field becomes constant, namely under stable condition (for example, non-move condition of portable telephone), as will be discussed later in detail. --

Column 8,
Line 35, after "performs", please insert therefor -- an --.

Column 10,
Line 47, before "operated", please insert therefor -- 1 --.

Column 15,
Line 47, please delete "this,", and insert therefor -- this --.
Line 60, after "unit", please insert therefor -- 5 --.

Column 19,
Line 29, please delete "et", and insert therefor -- set --.
Line 62, after ""0"", please insert therefor -- , -- (comma).

UNITED STATES PATENT AND TRADEMARK OFFICE
CERTIFICATE OF CORRECTION

PATENT NO. : 6,577,852 B1
DATED : June 10, 2003
INVENTOR(S) : Yasushi Iwata et al.

It is certified that error appears in the above-identified patent and that said Letters Patent is hereby corrected as shown below:

Column 21,
Line 58, please delete "a".

Signed and Sealed this

Sixth Day of January, 2004

JAMES E. ROGAN
*Director of the United States Patent and Trademark Office*